United States Patent [19]

Lindner

[11] Patent Number: 4,696,837
[45] Date of Patent: * Sep. 29, 1987

[54] CHEMICAL VAPOR DEPOSITION METHOD OF PRODUCING FLUORINE-DOPED TIN OXIDE COATINGS

[75] Inventor: Goerg H. Lindner, KV Vlissingen, Netherlands

[73] Assignee: M&T Chemicals Inc., Woodbridge, N.J.

[*] Notice: The portion of the term of this patent subsequent to May 20, 2003 has been disclaimed.

[21] Appl. No.: 797,364

[22] Filed: Nov. 12, 1985

Related U.S. Application Data

[63] Continuation-in-part of Ser. No. 748,648, Jun. 25, 1985, abandoned, which is a continuation-in-part of Ser. No. 687,067, Dec. 28, 1984, Pat. No. 4,590,096.

[51] Int. Cl.$^4$ .................................................. C23C 16/40
[52] U.S. Cl. .................... 427/255.3; 65/60.52; 427/109; 427/166; 427/255
[58] Field of Search ............ 427/109, 160, 166, 126.3, 427/85, 162, 255, 255.3; 65/60.52, 60.51, 60.5

[56] References Cited

U.S. PATENT DOCUMENTS

| | | | |
|---|---|---|---|
| 4,146,657 | 3/1979 | Gordon | 427/255.3 |
| 4,293,594 | 10/1981 | Yuldas et al. | 427/109 X |
| 4,419,386 | 12/1983 | Gordon | 427/109 |
| 4,476,158 | 10/1984 | Baumberger et al. | 427/255.3 |
| 4,500,567 | 2/1985 | Kato et al. | 427/109 X |
| 4,590,096 | 5/1986 | Lindner | 427/109 |

Primary Examiner—Sadie L. Childs
Attorney, Agent, or Firm—S. H. Parker; R. E. Bright

[57] ABSTRACT

In accordance with the invention, there is provided herein an improved chemical vapor deposition method for forming fluorine-doped tin oxide coatings using a liquid coating composition which includes a reactive organic fluorine dopant and an organotin compound. The method is carried out under a defined set of process conditions such that the coating produced has a minimum and constant sheet resistance which is substantially independent of deposition temperature.

62 Claims, 2 Drawing Figures

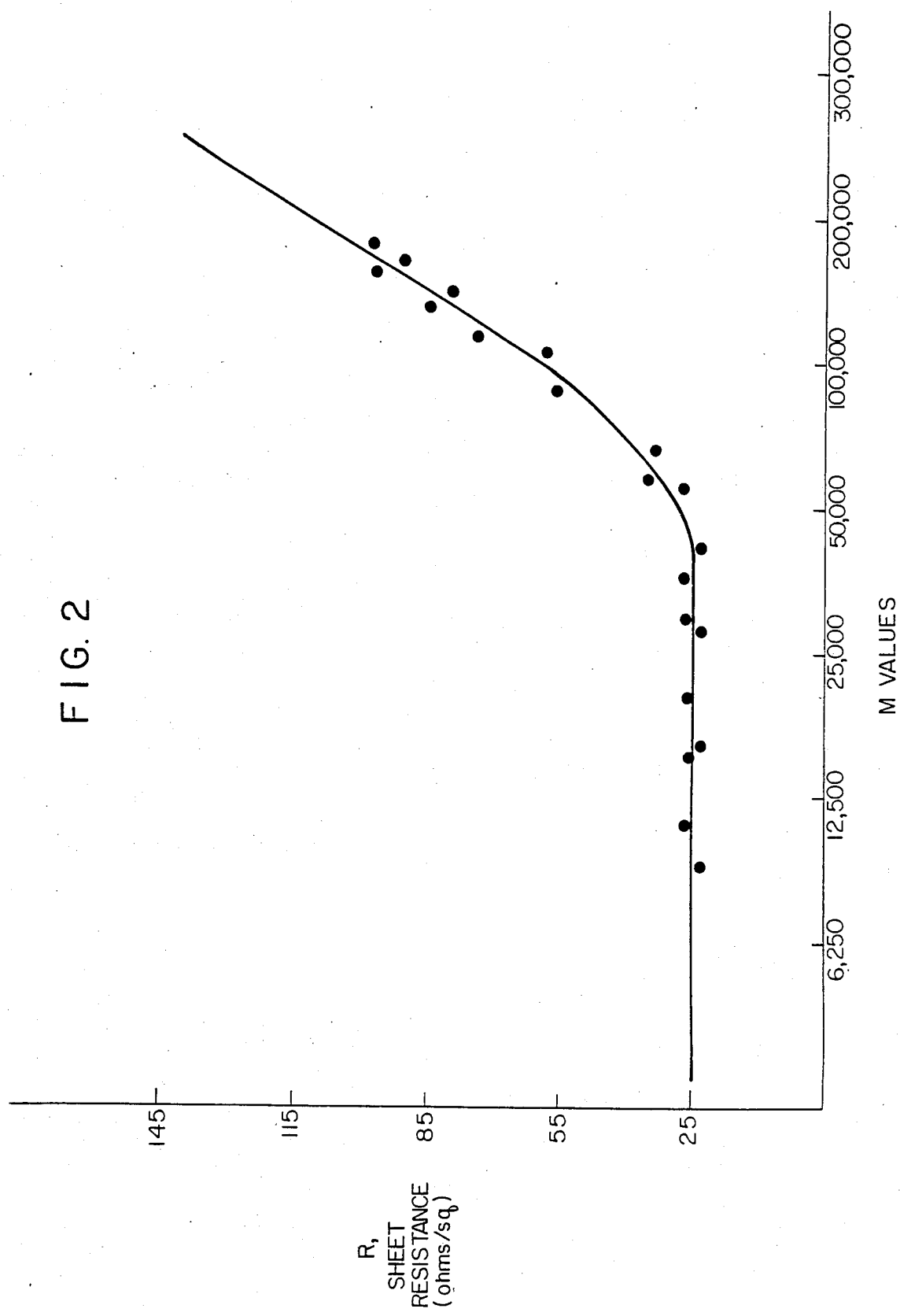

CHEMICAL VAPOR DEPOSITION METHOD OF PRODUCING FLUORINE-DOPED TIN OXIDE COATINGS

CROSS-REFERENCE TO RELATED APPLICATIONS

This application is a continuation-in-part of U.S. Ser. No. 748,648, filed June 25, 1985, now abandoned which itself was a continuation-in-part of co-pending U.S. Ser. No. 687,067, filed Dec. 28, 1984 by Georg H. Lindner U.S. Pat No. 4,590,096.

BACKGROUND OF THE INVENTION

1. Field of the Invention

This invention relates to tin oxide coatings, and more particularly, to an improved method of producing fluorine-doped tin oxide coatings by chemical vapor deposition.

2. Description of the Prior Art

Fluorine-doped tin oxide coatings are known to impart useful properties to many different substrate surfaces, including glass, ceramics, metals and elemental filaments. Such coated substrates find use as heat reflective elements, in energy efficient windows and in optoelectronic and semiconductor devices.

Chemical vapor deposition of tin oxide coatings has been described in the literature, See, for example, U.S. Pat. Nos. 3,677,814; 3,949,146; 4,130,673; 4,146,657; 4,213,594; 4,265,974; Thin Solid Films 77, 51–63 (1981); 65–66; and J. Electrochem. Soc. 122, 1144 (1975).

The chemical vapor deposition method described in the prior art suffers from one or more disadvantages in that the process conditions, or compositions used, or the properties of the resulting tin oxide coatings, are not entirely satisfactory for certain commercial applications. For example, where the product is an energy efficient window, success has been limited by the relatively high and variable sheet resistance of the coatings obtained in the process, and the low deposition rates.

Kane in U.S. Pat. No. 3,949,146 describes chemical vapor deposition of tin oxide coatings from dibutyltin diacetate, bis(tri-n-propyl)tin oxide or bis(tri-n-butyl)tin oxide doped with antimony. However, there is no disclosure of a method of producing a low sheet resistance fluorine-doped coating whose resistance is independent of process variables.

A chemical deposition method also is disclosed by Kato in U.S. Pat. No. 4,500,567. This process uses a gaseous mixture of monobutyltin trichloride and a halodifluoromethane which is formed from separate gaseous streams of each reactant. The gaseous mixture then is deposited onto a glass surface. However, in this method the electrical properties of the coating are not adequate, and the deposition times are long.

As will be apparent from the above-described review of the prior art, there is a need for an improved chemical vapor deposition process of making fluorine doped tin oxide coatings, particularly a process which will provide such coatings having a constant and minimum sheet resistance under a range of process conditions.

SUMMARY OF THE INVENTION

In accordance with the invention, there is provided herein an improved chemical vapor deposition method for forming fluorine-doped tin oxide coatings using a liquid coating composition which includes a reactive organic fluorine dopant and an organotin compound. The method is carried out under a defined set of process conditions such that the coating produced has a minimum and constant sheet resistance which is substantially independent of temperature. The variables in this process are the concentrations, in the vapor phase, of carrier gas, water, organic fluorine dopant and organotin compound. These concentrations are related by a parameter M, which is defined by the equation:

$$M = \frac{(AIR)(H_2O)}{(OFD)(O)},$$

where
(AIR) is the concentration in moles of carrier gas;
($H_2O$) is the concentration in moles of water in the carrier gas;
(OFD) is the concentration in moles of organic fluorine dopant in the carrier gas, and
(O) is the concentration in moles of organotin compound in the carrier gas.

Suitably, M has a value of 50,000 or less, preferably 20,000 or less. At these M values, the deposited tin oxide coating has a minimum and constant sheet resistance which is substantially independent of deposition temperature. At M values higher than those proscribed herein, the sheet resistance increases substantially with increasing M and increases with deposition temperature.

The chemical vapor deposition process is carried out using a liquid coating composition which comprises 1–30 wt. % of the organic fluorine dopant, and 70–99% of the organotin compound. A preferred composition is 2–10% of the organic fluorine dopant and 90–98 wt. % of the organotin compound, and, optionally, 1–10 wt. % of a polar organic solvent.

Deposition is carried out on glass to produce a fluorine-doped tin oxide coating of a thickness of 180–210 nm which has a minimum and constant sheet resistance of about 5 ohms/sq. for M values which are 50,000 or below, preferably 20,000 or below.

BRIEF DESCRIPTION OF THE DRAWINGS

FIG. 2 is a graph of sheet resistance vs. M values for tin oxide coatings produced in accordance with the process of this invention.

DETAILED DESCRIPTION OF THE INVENTION

Figure 1:
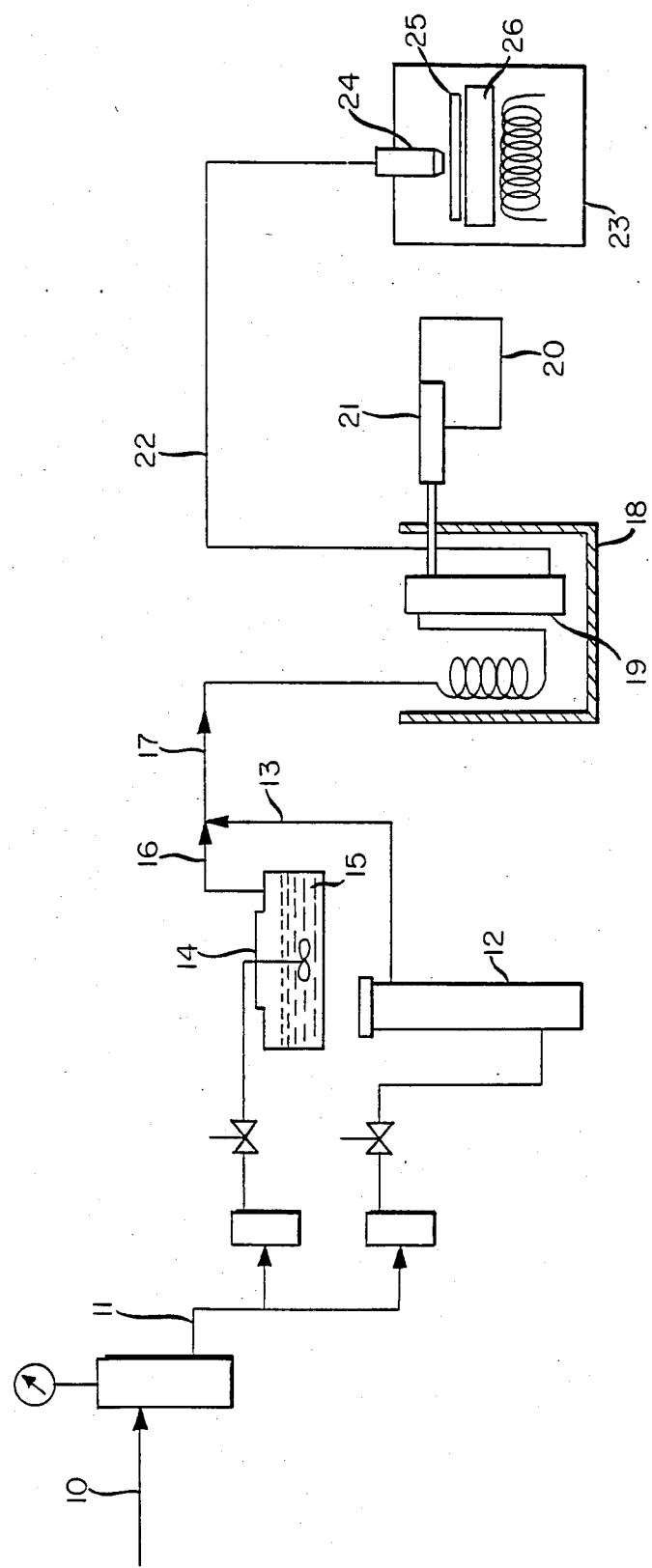
FIG. 1 is a schematic illustration of an apparatus for carrying out a suitable chemical vapor deposition process.

Referring now to FIG. 1, there is shown a diagrammatic representation of an apparatus suitable for carrying out the chemical vapor deposition process of the present invention. A carrier gas 10 which includes oxygen, with air being preferred, is metered through a feed line 11 and through an air dryer tower 12 to provide a stream 13 of dry air. A separate air stream is directed through a humidifier 14 containing a suitably quantity of water 15 to provide a wet air stream 16 at a desired relative humidity. Thereby a wet air stream 17, is passed through an evaporator 18 containing vessel 19 which holds a liquid coating composition supplied to evaporator 18 by syringe pump 20 and syringe 21. The air stream is heated from an oil bath (not shown) to a desired vaporization temperature.

The vaporized liquid coating composition in the air stream 22 then travels to a deposition chamber 23 having a coating nozzle 24 in which a substrate 25 is mounted on a heated plate 26. After deposition of the desired coating the gaseous by-products of the deposition are exhausted.

The liquid coating composition in the process of the invention comprises:

(a) 1-30 wt. % of a reactive organic fluorine dopant compound where at least one fluorine atom is located alpha or beta to a functional group wherein carbon is bonded to oxygen selected from carboxylic acid, anhydride, ester, alcohol, ketone, acid halide or ether; and (b) 70-99 wt. % of an organotin compound which is an alkyltin trichloride, a dialkyltin dichloride, an alkyldichlorotin acetate, an alkyl chlorodiacetate, or an ester tin trichloride, or tin tetrachloride.

Accordingly, suitable functional groups and reactive organic fluorine dopants include the following:

Carboxylic acids trifluoroacetic acid
chlorodifluoroacetic acid
difluoroacetic acid
heptofluorobutynic acid
pentafluoropropionic acid
3-trifluoromethylcrotonic acid

Anhydrides trifluoroacetic anhydride
heptafluorobutyric anhydride
pentafluoropropionic anhydride
chlorodifluoroacetic anhydride
perfluoroglutaric anhydride
perfluorosuccinic anhydride

Esters ethyl trifluoroacetate
butyl trifluoroacetate
ethyl bromodifluoroacetate
ethyl chlorofluoroacetate
methyl pentafluoropropionate
methyl heptofluorobutyrate
methyl trifluoroacetate
methyl perfluorobuten-3-oate
2,2,2-trifluoroethyltrifluoroacetate
1,1,1-trifluoroisopropylacetate

Alcohols 2,2,2-trifluoroethanol
1H,1H-heptafluorobutanol-1
3,3,4,4,5,5,5-heptafluoropentanol-2
heptafluoroisopropanol
hexafluoro-2-methylisopropanol
1H,1H,5H-octafluoro-1-pentanol
perfluoro-t-butanol
2-trifluoromethylpropanol-2
1,1,1-trifluoropropanol-2

Ketones ethyl 4,4,4-trifluoroacetoacetate
1,1,1-trifluoroacetylacetone
bis(perfluoroisopropyl)ketone
3-bromo-1,1,1-trifluoropropanone
ethyl 4,4,4-trifluoroacetoacetate
hexafluoroacetylacetone
pentafluoroethyl ethyl ketone
1,1,1-trifluoroacetone
methyl heptafluoropropyl ketone

Acid halides heptafluorobutyryl chloride
perflouroglutaryl fluoride
perfluoroctanoyl chloride
perfluorosuccinyl chloride

Ethers 2-chloro-1,1,2-trifluoroethyl methyl ether
2-chloro-1,1,2-trifluoroethyl ethyl ether Representative reactive organic fluorine dopants include trifluoroacetic acid, trifluoroacetic anhydride, ethyl trifluoroacetoacetate, trifluoroethanol, ethyl trifluoroacetate, pentafluoropropionic acid, 2-chloro-1,1,2-trifluoroethyl methyl ether, 1,1,1-trifluoroacetylacetone and heptafluorobutyryl chloride.

Typical organotin compounds include monobutyltin trichloride, dibutyltin dichloride, butyldichlorotin acetate, butylchlorotin diacetate, carbethoxyethyltin trichloride. Tin tetrachloride also may be used as the tin compound.

In a preferred form of the invention, the liquid coating composition includes 2-10 wt % of the organic fluorine compound, and 90-98 wt % of the organotin compound.

The liquid coating composition of the invention may include also a polar organic compound, in an amount of about 1-10 wt % of the composition, which will insure stability of the liquid composition at low temperatures. When the polar organic liquid is present, the liquid coating composition includes 2-10 wt % of the organic fluorine dopant, 80-97 wt % of the organotin compound and 1-10 wt % of the polar organic liquid.

In a preferred form of the invention the organic fluorine dopant is trifluoroacetic acid, trifluoroacetic anhydride, or ethyl trifluoroacetoacetate, and the organotin compound is monobutyltin trichloride.

The vaporization temperature in the process suitably ranges from about 100° to about 400° C., and preferably about 150° to 250° C. The substrate temperature ranges from about 400° to about 700° C., and preferably about 550° to about 650° C.

The carrier gas is an oxygen-containing gas which may be air, or a mixture of oxygen and an inert gas, and is preferably air.

The carrier gas contains water vapor in the process of the invention.

The substrate to be coated may be glass, ceramics, solid state materials, metals, elemental filaments and the like.

The sheet resistance (ohms/sq) of the tin oxide film is measured with a conventional four point probe according to ASTM standard method F374–81.

The film thickness is measured by the beta-back-scatter method according to British Standards Institution method BS5411: Part 12, 1981, ISO 3543–1981.

Referring now to FIG. 2, it is seen that the parameter M, which defines the process conditions of this invention, can be varied to provide fluorine-doped tin oxide coatings having a minimum and constant sheet resistance. For M values below 50,000, the sheet resistance of the coating, at a thickness of about 180 to 210 nm is 25 ohm/sq. For M values above 50,000, the sheet resistance increases rapidly with increasing M.

EXAMPLE 1

Tin Oxide Coatings Made Under Conditions in which the "M" Value is Below 50,000.

A liquid coating composition of 100 parts monobutyltin trichloride (MBTC), 4.04 parts trifluoroacetic acid (TFA) and 1.45 parts acetic anhydride (AA) (specific gravity 1.62) was pumped at a rate of 10.5 g/hr, into an evaporator heated to 120° C., corresponding to 0.035 mol/hr. of MBTC and 0.0035 mol/hr. of TFA. Then wet air containing 28.8 mol/hr. of air and 0.067 mol/hr. of $H_2O$ was passed through the evaporator, and the vapor was deposited in 20 seconds onto a glass slide heated to 500° C. The coating thus produced had a thickness of 210 nm. The calculated M value was 16,000. The measured sheet resistance of the coating was 25 ohms/sq.

EXAMPLE 2

Tin Oxide Coatings Made Under Conditions in which the "M" Value is Above 50,000.

A liquid coating composition of 100 parts MBTC, 2 parts TFA and 0.72 parts AA was pumped into the evaporator at a rate of 10.5 g/hr., corresponding to 0.036 mol/hr of MBTC and 0.0018 mol/hr of TFA. Then wet air containing 27.6 mole/hr of air and 1.02 mol/$H_2O$ was passed through the evaporator and the vapor mixture thus-formed was deposited onto a glass slide heated to 500° C. In 12 seconds a fluorine-doped tin oxide coating having a thickness of 190 nm was produced. The calculated M value was $4.3 \times 10^5$. The measured sheet resistance of the coating was 239 ohms/sq.

EXAMPLE 3

Following the procedure of Exs. 1 and 2, small variations in the concentrations of MBTC, TFA, air and water corresponding to M values below and above 50,000 were tested and recorded in the graph of FIG. 2. Below 50,000 the sheet resistance was measured as substantially a minimum and constant value of about 30 ohms/sq., while for M values greater than 20,000, the sheet resistance was substantially higher, and increased rapidly with increasing M values.

The doped tin oxide coatings of the invention which are made within prescribed M values also are observed to have a minimum and constant sheet resistance over a wide range of deposition temperatures, whereas similar coatings made at higher M values (above 50,000) exhibit an increasing sheet resistance at different deposition temperatures.

While the invention has been described with reference to certain embodiments thereof, it will be understood that changes and modifications may be made which are within the skill of the art. Accordingly, it is intended to be bound only by the appended claims, in which:

What is claimed is:

1. An improved chemical vapor deposition method of producing a fluorine-doped tin oxide coating which has a minimum and constant sheet resistance under different process conditions, comprising:
    (a) forming a liquid coating composition comprising:
        (1) an organic fluorine dopant wherein at least one fluorine atom is located alpha or beta to a functional group wherein carbon is bonded to oxygen selected from carboxylic acid, anhydride, ester, alcohol, ketone, acid halide, or ether; and
        (2) an organotin compound, which is an alkyltin trichloride, a dialkyltin dichloride an alkyldichlorotin acetate, a dialkylchlorotin diacetate, or an ester tin trichloride; or tin tetrachloride;
    (b) vaporizing said liquid coating composition into a wet carrier gas to form a vapor mixture of carrier gas, water, organic fluorine dopant and said organotin compound or said tin tetrachloride; and
    (c) decomposing said vapor mixture on a substrate to form said coating, characterized in that: the vapor concentrations of said components are such that a parameter M, defined as:

$$M = \frac{(AIR)(H_2O)}{(OFD)(O)}$$

where
(AIR) is the concentration of the carrier gas, in moles 1 hr,
($H_2O$) is the concentration of water in the carrier gas, in moles 1 hr,
(OFD) is the concentration of organic fluorine dopant in the carrier gas, in moles 1 hr, and
(O) is the concentration of organotin compound in the carrier gas, in moles 1 hr,
has a value of less than 50,000, thereby to produce a fluorine-doped tin oxide coating having a minimum and constant sheet resistance for said values of M.

2. A process according to claim 1 wherein M has a value of 20,000 or less.

3. A process according to claim 1 in which the sheet resistance is about 25 ohms/sq. at a thickness of about 180–210 nm.

4. A process according to claim 1 in which the liquid coating composition comprises 2–10 wt. % of said organic fluorine dopant, and 90–98% of said organotin compound.

5. A process according to claim 1 wherein said liquid coating composition includes 1–10 wt. % of a polar organic compound.

6. A process according to claim 5 wherein said composition includes 2–10 wt. % of said organic fluorine dopant, 80–97 wt. % of said organotin compound, and 1–10 wt. % of said polar organic compound.

7. A process according to claim 6 wherein said polar organic compound is acetic anhydride, ethyl acetate or methylisobutylketone.

8. A process according to claim 1 wherein said vaporization temperature is 100°–400° C.

9. A process according to claim 1 wherein said deposition temperature is above 400° and below 700° C.

10. A process according to claim 1 wherein said substrate is glass.

11. The product of the process of claim 1 having a substantially minimum and constant sheet resistance with increasing deposition temperature.

12. A process according to claim 1 wherein said function group is a carboxylic acid.

13. A process according to claim 1 wherein said functional group is an anhydride.

14. A process according to claim 1 wherein said functional group is an ester.

15. A process according to claim 1 wherein said functional group is an alcohol.

16. A process according to claim 1 wherein said functional group is a ketone.

17. A process according to claim 1 wherein said functional group is an acid halide.

18. A process according to claim 1 wherein said functional compound is an alkyltin trichloride.

19. A process according to claim 1 wherein said organotin compound is a dialkyltin dichloride.

20. A process according to claim 1 wherein said organotin compound is an alkylchlorotin diacetate.

21. A process according to claim 1 wherein said organotin compound is an ester tin trichloride.

22. A process according to claim 1 wherein said liquid coating composition comprises:
(a) 1–30 wt. % of a reactive organic fluorine dopant compound which is trifluoroacetic acid, trifluoroacetic anhydride, ethyl trifluoroacetoacetate, trifluoroethanol, ethyl trifluoroacetate, pentafluoropropionic acid, 2-chloro-1,1,2-trifluoroethyl methyl ether, or 1,1,1-trifluoroacetylacetone; and
(b) 70–99 wt. % of an organotin compound which is an alkyltin trichloride, a dialkyltin dichloride, an alkyldichlorotin acetate, an alkylchlorotin diacetate, an ester tin trichloride; or tin tetrachloride.

23. A process according to claim 22 wherein said organotin compound is monobutyltin trichloride, methyltin trichloride, isobutyltin trichloride, dibutyltin dichloride, di-t-butyltin dichloride, butyldichlorotin acetate, butylchlorotin diacetate, or carbethoxyethyltin trichloride.

24. A process according to claim 1 in which said fluorine dopant is 2–10 wt. % and said organotin compound is 90–98 wt. % of the composition.

25. A process according to claim 1 in which said fluorine dopant is about 5 wt. % and said organotin compound is about 95 wt. % of the composition.

26. A process according to claim 22 in which said fluorine dopant is trifluoroacetic acid.

27. A process according to claim 22 in which said fluorine dopant is trifluoroacetic anhydride.

28. A process according to claim 22 in which said fluorine dopant is ethyl trifluoroacetoacetate.

29. A process according to claim 22 in which said fluorine dopant is trifluoroethanol.

30. A process according to claim 22 in which said fluorine dopant is ethyl trifluoroacetate.

31. A process according to claim 22 in which said fluorine dopant is pentafluoropropionic acid.

32. A process according to claim 22 in which said fluorine dopant is 2-chloro-1,1,2-trifluoroethyl methyl ether.

33. A process according to claim 22 in which said fluorine dopant is 1,1,1-trifluoroacetylacetone.

34. A process according to claim 23 in which said organotin compound is monobutyltin trichloride.

35. A process according to claim 23 in which said organotin compound is methyltin trichloride.

36. A process according to claim 23 in which said organotin compound is isobutyltin trichloride.

37. A process according to claim 23 in which said organotin compound is dibutyltin dichloride.

38. A process according to claim 23 in which said organotin compound is di-t-butyltin dichloride.

39. A process according to claim 23 in which said organotin compound is butyldichlorotin acetate.

40. A process according to claim 15 in which said organotin compound is butylchlorotin diacetate.

41. A process according to claim 23 in which said organotin compound is carbethoxyethyltin trichloride.

42. A process according to claim 23 in which said fluorine dopant is trifluoroacetic acid, and said organotin compound is monobutyltin trichloride.

43. A process according to claim 23 comprising 2–10 wt. % of said organic fluorine dopant and 90–98 wt. % of said organotin compound.

44. A process according to claim 43 in which said fluorine dopant is trifluoroacetic acid and said organotin compound is monobutyltin trichloride.

45. A process according to claim 43 in which said fluorine dopant is trifluoroacetic and said organotin compound is butyldichlorotin acetate.

46. A process according to claim 43 in which said fluorine dopant is ethyl trifluoroacetoacetate and said organotin compound is monobutyltin trichloride.

47. A process according to claim 43 in which said fluorine dopant is trifluoroacetic acid and said organotin compound is diisobutyltin dichloride.

48. A process according to claim 43 in which said fluorine dopant is ethyl trifluoroacetate and said organotin compound is monobutyltin trichloride.

49. A process according to claim 43 in which said fluorine dopant is pentofluoropropionic acid and said organotin compound is monobutyltin trichloride.

50. A process according to claim 43 in which said fluorine dopant is trifluoroethanol and said organotin compound is monobutyltin trichloride.

51. A process according to claim 43 in which said fluorine dopant is 2-chloro-1,1,2-trifluoroethyl methyl ether and said organotin compound is monobutyltin trichloride.

52. A process according to claim 43 in which said fluorine dopant is 1,1,1-trifluoroacetyl acetone and said organotin compound is monobutyltin trichloride.

53. A process according to claim 1 which also includes 1–10 wt. % of a polar organic compound.

54. A process according to claim 53 in which said fluorine dopant is 2–10 wt. %, said organotin compound is 80–97 wt. %, and said polar organic compound is 1–10 wt. %, of said composition.

55. A process according to claim 54 comprising 2–10 wt. % of trifluoroacetic acid, 80–97 wt. % of monobutyltin trichloride and 1–10 wt. % of a polar organic liquid.

56. A process according to claim 54 in which the polar organic compound is methylisobutyl ketone, acetic anhydride or ethyl acetate.

57. A process according to claim 1 for making high quality fluorine-doped tin oxide coatings having a low sheet resistance and high visible light transmission in which said composition comprises:
(a) 1–30 wt. % of a reactive organic fluorine dopant compound where at least one fluorine atom is located alpha or beta to a functional group wherein carbon is bonded to oxygen selected from carboxylic acid, anhydride, ester, alcohol, ketone, acid halide, or ether and
(b) 70–99 wt. % of tin tetrachloride.

58. A process according to claim 57 in which said composition comprises:
(a) 1–30 Wt. % of an organic fluorine dopant compound which is trifluoroacetic acid, trifluoroacetic anhydride, ethyl trifluoroacetoacetate, trifluoroethanol, ethyl trifluoroacetate, pentafluoropropionic acid, 2-chloro-1,1,2-trifluoroethyl methyl ether, or 1,1,1-trifluoroacetylacetone; and (b) 70-99 wt. % of tin tetrachloride.

59. A process according to claim 57 in which said fluorine dopant is 2-10 wt. %, and said tin tetrachloride is 90-98 wt. % of the composition.

60. A process according to claim 57 in which said fluorine dopant is about 5 wt. %, and said tin tetrachloride is about 95 wt. % of the composition.

61. A process according to claim 60 in which said fluorine dopant is trifluoroacetic acid.

62. A process according to claim 1 wherein said organic fluorine dopant is present in an amount of 1-30 wt. % of said composition, and said organotin compound is present in an amount of 70-99 wt. % of said composition.

* * * * *